United States Patent [19]

Matsuzawa

[11] Patent Number: 5,121,082
[45] Date of Patent: Jun. 9, 1992

[54] BUFFER CIRCUIT

[75] Inventor: Akira Matsuzawa, Neyagawa, Japan

[73] Assignee: Matsushita Electric Industrial Co., Ltd., Osaka, Japan

[21] Appl. No.: 625,473

[22] Filed: Dec. 11, 1990

[30] Foreign Application Priority Data

Dec. 15, 1989 [JP] Japan ................................. 1-326318

[51] Int. Cl.[5] .............................................. H03F 1/34
[52] U.S. Cl. ................................. 330/293; 330/288; 307/270
[58] Field of Search ................ 330/252, 257, 260, 261, 330/288, 203, 296, 85; 307/270, 296.1

[56] References Cited

U.S. PATENT DOCUMENTS 4,539,491  9/1985  Nishioka et al. ................. 330/260 X
4,584,535  4/1986  Seevinck .............................. 330/257

OTHER PUBLICATIONS

Okumura, "Design of OP amp-circuits" (continued), p. 70 and 71, (1978).

Primary Examiner—Steven Mottola
Attorney, Agent, or Firm—Stevens, Davis, Miller & Mosher

[57] ABSTRACT

A buffer circuit includes an operational amplifier circuit, a first emitter follower circuit whose base is driven by an output of the operational amplifier circuit and whose output is fed back to an inverting input terminal of the operational amplifier circuit, and a second emitter follower circuit whose base is also driven by the output of the operational amplifier circuit and whose output drives a load circuit. In another form, the buffer circuit also includes a current control circuit that detects operation current flowing through the second emitter follower circuit, thereby controlling the operation current flowing through the first emitter follower circuit.

2 Claims, 3 Drawing Sheets

BUFFER CIRCUIT

BACKGROUND OF THE INVENTION

1. Field of the Invention

This invention relates to a buffer circuit.

2. Description of the Prior Art

FIG. 5 shows the structure of a typical prior art buffer circuit. In the prior art buffer circuit shown in FIG. 5, an operational amplifier circuit 1 is connected at its output terminal to a load so as to drive the load, while, at the same time, its output is fed back to its inverting input terminal, and an input signal 2 is applied to its non-inverting input terminal.

It is known that, when a capacitive load 3 is connected to the output terminal of the prior art buffer circuit as shown in FIG. 5, great ringing tends to occur, with the result that the settling time is extended or, in some case, undesirable oscillation is given rise to. (This fact is described in, for example, a book entitled "Design of Operational Amplifier circuits, Second Series" pages 70 and 71, , written by Okamura and published by CQ publishing Company.) The above situation is shown in FIG. 6. It will be seen in FIG. 6 that, when the input signal level changes stepwise as shown by the one-dot chain curve, ringing occurs in the output waveform shown by the solid curve, with the result that the settling time is inevitably extended.

The ringing occurs in the prior art buffer circuit shown in FIG. 5 for the reason that the direct connection of the capacitive load to the feedback circuit system decreases the phase margin of the feedback circuit system. This problem is usually solved by increasing the phase compensation capacity of the operational amplifier. However, this increase in the phase compensation capacity of the operational amplifier increases the response time constant of the circuit system. In addition, when the load capacity is to be changed, it is necessary to correspondingly change the internal phase compensation capacity. Thus, it has been practically difficult to buffer a high speed pulse signal.

SUMMARY OF THE INVENTION

With a view to solve the prior art problem described above, it is an object of the present invention to provide a buffer circuit which can operate with a satisfactory settling characteristic without causing occurrence of objectionable ringing.

The present invention which solves the prior art problem provides a buffer circuit comprising an operational amplifier circuit, a first emitter follower circuit whose base is driven by the output of the operational amplifier circuit, and a second emitter follower circuit whose base is also driven by the output of the operational amplifier circuit, the output of the first emitter follower circuit being fed back to an inverting input terminal of the operational amplifier circuit, and the output of the second emitter follower circuit driving a load circuit.

In the buffer circuit of the present invention having the structure described above, the capacitive load is not directly connected to the feedback circuit system for the operational amplifier. Therefore, no change occurs in both the gain of the feedback circuit system and the signal phase fed back through the feedback circuit system, so that neither ringing nor oscillation can occur. Also, the d.c. level of the signal fed back from the first emitter follower circuit to the inverting input terminal of the operational amplifier circuit and the d.c. level of the output signal of the second emitter follower circuit differ from each other only by an amount corresponding to the potential difference between the base-emitter voltages of the two transistors forming these two emitter follower circuits respectively. That is, these two d.c. levels are practically substantially equal to each other, and any large offset voltage does not appear between the input and output signals. Therefore, the buffer circuit of the present invention can operate with a satisfactory settling characteristic.

As described above, the buffer circuit according to the present invention comprises an operational amplifier circuit, a first emitter follower circuit whose base is driven by the output of the operational amplifier circuit, and a second emitter follower circuit whose base is also driven by the output of the operational amplifier circuit, the output of the first emitter follower circuit being fed back to an inverting input terminal of the operational amplifier circuit, and the output of the second emitter follower circuit driving a load circuit. Therefore, the buffer circuit of the present invention can operate with a satisfactory settling characteristic because, unlike the prior art buffer circuit, an increase in the load capacity does not increase the degree of ringing and does not give rise to oscillation. Another form of the buffer circuit according to the present invention further comprises a current control circuit detecting the operation current flowing through the second emitter follower circuit thereby controlling the operation current flowing through the first emitter follower circuit, so that the offset voltage does not practically make any substantial change even when the load current may be changed.

DESCRIPTION OF THE PREFERRED EMBODIMENTS

Embodiment 1

Figure 1:
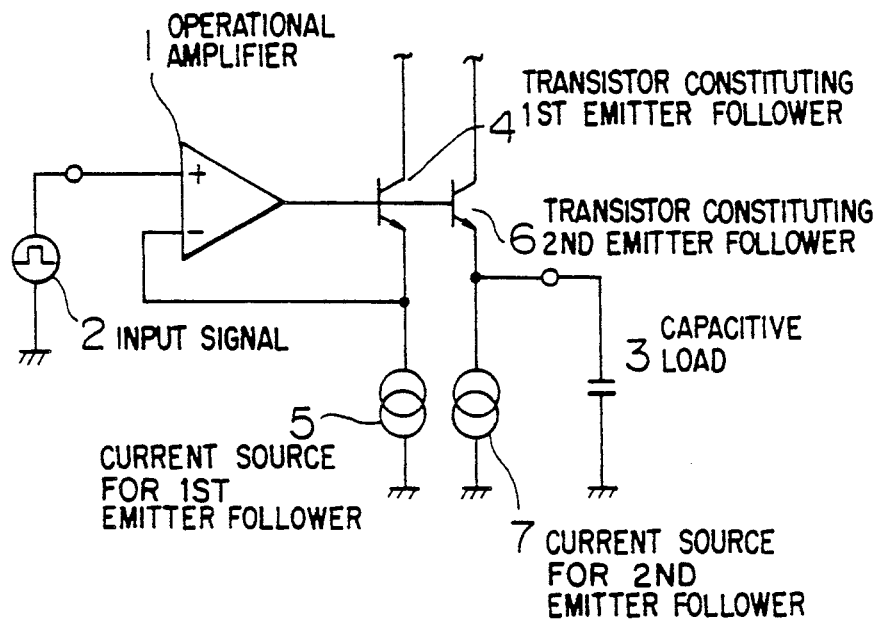
FIG. 1 is a circuit diagram showing the structure of a first embodiment of the buffer circuit according to the present invention.
Figure 5:
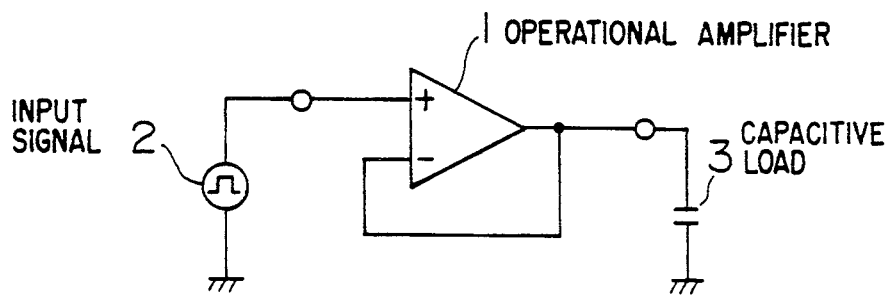
FIG. 5 is a circuit diagram showing the structure of a prior art buffer circuit.
Figure 6:
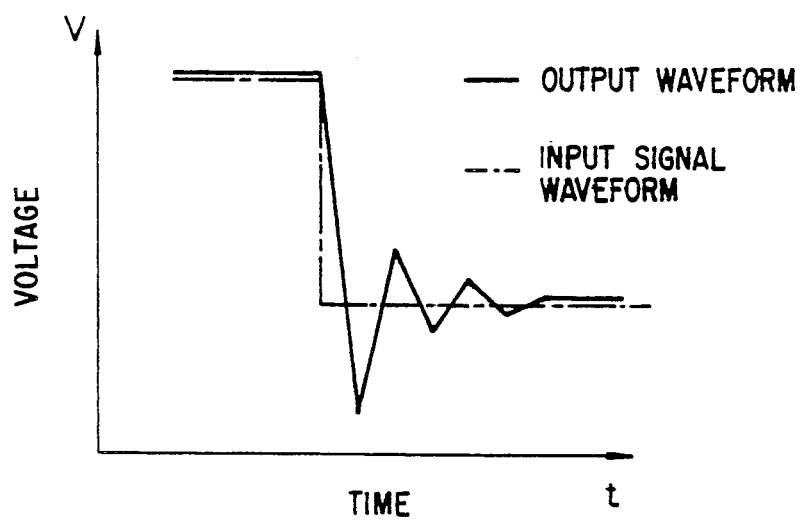
FIG. 6 is a voltage waveform diagram showing the transient response characteristic of the prior art buffer circuit shown in FIG. 5.

FIG. 1 is a circuit diagram showing the structure of a first embodiment of the buffer circuit according to the present invention. In FIG. 1, like reference numerals are used to designate like parts appearing in FIG. 5.

Referring to FIG. 1, an input signal 2 is applied to a non-inverting input terminal of an operational amplifier circuit 1 and this operational amplifier circuit 1 is connected at its output terminal to the base of a first transistor 4 constituting a first emitter follower circuit and also to the base of a second transistor 6 constituting a second emitter follower circuit. A first current source 5 supplying an operation current is connected to the emitter of the first transistor 4 so as to constitute the first emitter follower circuit together with the first transistor 4, and a second current source 7 is connected to the emitter of the second transistor 6 so as to constitute the second emitter follower circuit together with the second transistor 6. The output voltage of the operational amplifier circuit 1 is fed back to an inverting input terminal of the operational amplifier circuit 1 from the emitter of the first transistor 4 constituting the first emitter follower circuit. The output signal appearing from the emitter of the second transistor 6 constituting the second emitter follower circuit is applied to a capacitive load 3 to drive the load 3.

Figure 2:
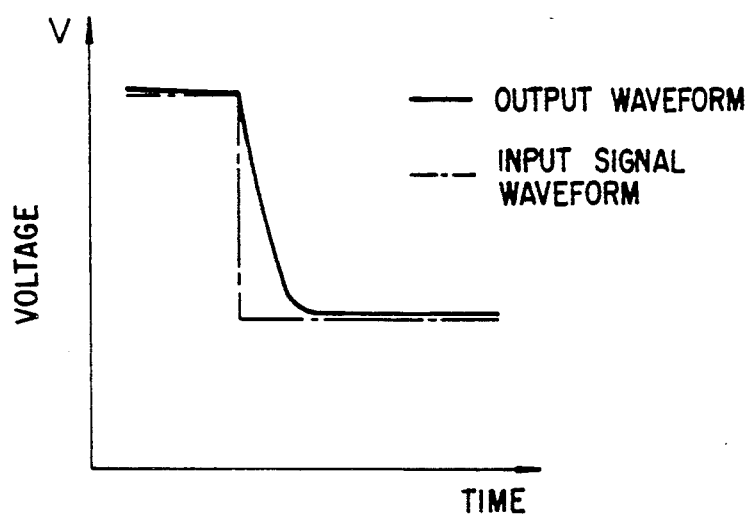
FIG. 2 is a voltage waveform diagram showing the transient response characteristic of the first embodiment of the buffer circuit shown in FIG. 1.

FIG. 2 shows the voltage response of the buffer circuit shown in FIG. 1. That is, FIG. 2 shows the response waveform of the output voltage appearing across the capacitive load 3 when the input signal 2 applied to the operational amplifier circuit 1 has a stepped waveform as shown by the one-dot chain curve. It will be seen in FIG. 2 that the response waveform of the output voltage is delayed by a period of time required until the charge in the capacitive load 3 is discharged by the current of the second current source 6 constituting the second emitter follower circuit. However, this response delay does not adversely affect the signal feedback through the negative feedback path, so that the ringing occurred in the prior art buffer circuit does not occur, and the settling time is also shortened.

Embodiment 2

Figure 3:
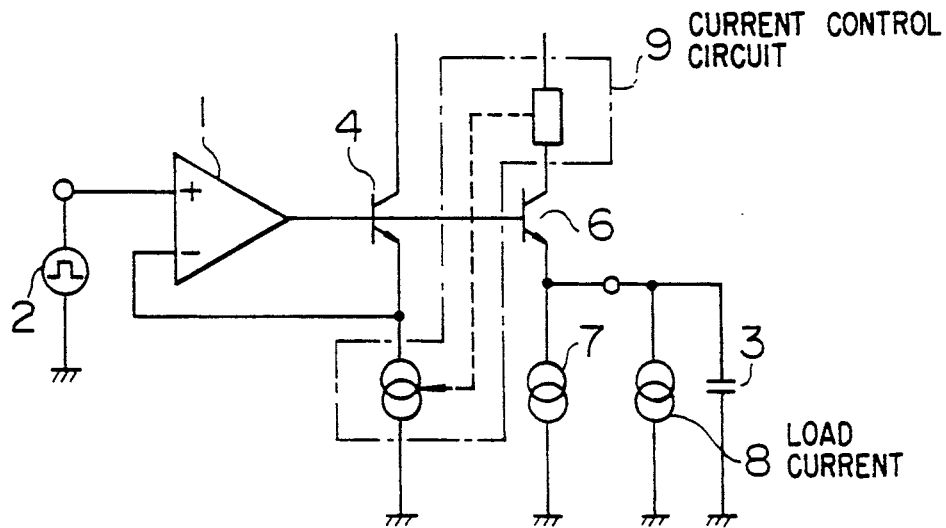
FIG. 3 is a circuit diagram showing the structure of a second embodiment of the buffer circuit according to the present invention.

FIG. 3 is a circuit diagram showing the structure of a second embodiment of the buffer circuit according to the present invention, and, in FIG. 3, the same reference numerals are used to designate the same parts appearing in FIG. 1. The object of this second embodiment is to suppress generation of an input-output offset voltage thereby improving the linearity when the load circuit includes a load current 8 besides the capacitive load 3. In order to meet the above object, a current control circuit 9 is added to the first embodiment shown in FIG. 1. This current control circuit 9 detects the operation current flowing through the second emitter follower circuit so as to control the operation current flowing through the first emitter follower circuit.

It is supposed now that the value of the offset voltage between the input and the output of the operational amplifier circuit 1 in the first embodiment of the buffer circuit is so small that it can be ignored. Then, the offset voltage $V_{of}$ in the entire buffer circuit is given by the potential difference between the base-emitter voltage $V_{be1}$ of the first transistor 4 constituting the first emitter follower circuit and the base-emitter voltage $V_{be2}$ of the second transistor 6 constituting the second emitter follower circuit. Therefore, this offset voltage $V_{of}$ is expressed as follows:

$$V_{of} = V_{be1} - V_{be2} \tag{1}$$

$$V_{be1} = Vt \cdot \ln(I_{e1}/I_{s1}) \tag{2}$$

$$V_{be2} = Vt \cdot \ln(I_{e2}/I_{s2}) \tag{2b}$$

In the above equations, $I_{e1}$ and $I_{e2}$ are emitter currents of the transistors 4 and 6 respectively, $I_{s1}$ and $I_{s2}$ are reverse saturation currents of the emitter junctions of the transistors 4 and 6 respectively, and Vt is a temperature-dependent voltage (about 26 mV at the room temperature). It can be seen from the above equations that the following relation is to be satisfied in order to reduce the offset voltage $V_{of}$ to zero:

$$I_{e1}/I_{e2} = I_{s1}/I_{s2} \tag{3}$$

The reverse saturation currents $I_{s1}$ and $I_{s2}$ of the emitter junctions of the respective transistors 4 and 6 in the equation (3) are proportional to the sizes of the emitter junctions of the respective transistors 4 and 6. Thus, the desired ratio between these reverse saturation currents $I_{s1}$ and $I_{s2}$ can be set with a practically sufficiently high accuracy according to the integrated circuit technology. Therefore, when the operation current flowing through the second emitter follower circuit is detected thereby controlling the operation current flowing through the first emitter follower circuit so as to satisfy the equation (3), the offset voltage can be minimized or maintained constant at a minimum value regardless of the value of the load current 8. However, when the response time constant of the current control circuit 9 is selected to show an excessively quick response, the current control circuit 9 will respond also to a transient current flowing toward the capacitive load 3, thereby degrading the settling characteristic. Therefore, it is necessary to select the response time constant so that the current control circuit 9 shows a relatively slow response.

Figure 4:
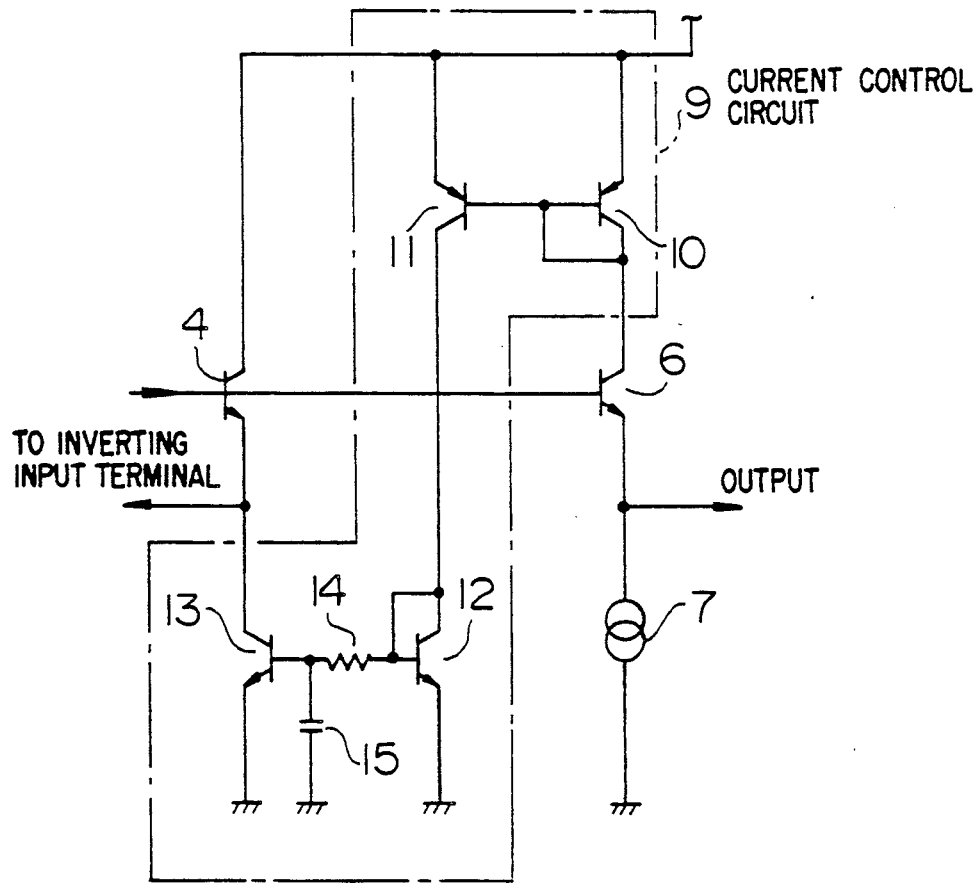
FIG. 4 is a circuit diagram showing in detail the structure of the current control circuit incorporated in the second embodiment of the buffer circuit shown in FIG. 3.

FIG. 4 shows in detail the structure of one form of the current control circuit 9.

Referring to FIG. 4, transistors 10, 11 and 12, 13 constitute current mirror circuits respectively. The transistor 10 in the first current mirror circuit detects the collector current of the transistor 6 constituting the second emitter follower circuit, and the transistor 11 produces a current whose value is proportional to the current value of the detected collector current and whose flowing direction is reverse to that of the detected collector current. This current is supplied to the transistor 12 in the second current mirror circuit, and the collector current of the transistor 13 provides the operation current source for the transistor 4 constituting the first emitter follower circuit. That is, the operation current of the transistor 6 and that of the transistor 4 have a proportional relation, and the proportional constant can be determined as desired by suitably changing the sizes of the emitter junctions of the transistors 10, 11, 12 and 13. This proportional constant can also be determined by inserting resistors (not shown) in the emitter circuits of these transistors 10 to 13 respectively and suitably changing the resistance ratios between the individual resistors.

A resistor 14 and a capacitor 15 are provided so as to suitably determine the response time constant of the current control circuit 9. That is, the combination of the resistor 14 and the capacitor 15 acts to stabilize the circuit system by determining the time constant so that the current control circuit 9 may not respond to a transient current that may flow when the capacitive load 3 is driven.

I claim:

1. A buffer circuit comprising an operational amplifier circuit, a first emitter follower circuit whose base is driven by an output of said operational amplifier circuit, and a second emitter follower circuit whose base is also driven by the output of said operational amplifier circuit, an output of said first emitter follower circuit being fed back to an inverting input terminal of said operational amplifier circuit, and an output of said second emitter follower circuit driving a load circuit.

2. A buffer circuit comprising an operational amplifier circuit, a first emitter follower circuit whose base is driven by an output of said operational amplifier circuit, a second emitter follower circuit whose base is also driven by the output of said operational amplifier circuit, and a current control circuit detecting operation current flowing through said second emitter follower circuit thereby controlling operation current flowing through said first emitter follower circuit, an output of said first emitter follower circuit being fed back to an inverting input terminal of said operational amplifier circuit, and an output of said second emitter follower circuit driving a load circuit.

* * * * *